(12) United States Patent
Abe

(10) Patent No.: US 6,774,380 B2
(45) Date of Patent: Aug. 10, 2004

(54) VARIABLY SHAPED BEAM EB WRITING SYSTEM

(75) Inventor: Takayuki Abe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/255,580

(22) Filed: Sep. 27, 2002

(65) Prior Publication Data
US 2003/0062489 A1 Apr. 3, 2003

(30) Foreign Application Priority Data
Sep. 28, 2001 (JP) ...................................... 2001-302639

(51) Int. Cl.[7] ............................................. H01J 37/302
(52) U.S. Cl. ............................. 250/492.23; 250/492.2; 250/492.22
(58) Field of Search ........................ 250/492.2, 492.22, 250/492.23

(56) References Cited

U.S. PATENT DOCUMENTS 5,210,696 A * 5/1993 Yano ........................... 716/21
5,305,225 A * 4/1994 Yamaguchi et al. ......... 700/160
2002/0036273 A1 * 3/2002 Okino ..................... 250/491.1

OTHER PUBLICATIONS

R. Yoshikawa, et al., "A High Dose and High Accuracy Variable Shaped Electron Beam Exposure System for Quartermicron Device Fabrication," J. Vac. Sci. Technol., B5(1), Jan./Feb. 1987, pp. 70–74.

* cited by examiner

Primary Examiner—Nikita Wells
Assistant Examiner—Christopher M. Kalivoda
(74) Attorney, Agent, or Firm—Oblon, Spivak, McClelland, Maier & Neustadt, P.C.

(57) ABSTRACT

A variably shaped beam EB writing system which draws a pattern, comprises a recognition module, an adjustment module, and a drawing module. The recognition module recognizes at least one of a first length unit to specify a pattern length and a first position unit to specify a position described to a pattern data. The adjustment module adjusts at least one of a second length unit to specify a pattern length which is drawn by the variably shaped beam EB writing system and a second position unit to specify a position thereof to a value of which at least one of the first length unit and the first position unit are divided by a natural number. The drawing module draws a predetermined pattern based on at least one of the second length unit and the second position unit adjusted by the adjustment module.

16 Claims, 2 Drawing Sheets

VARIABLY SHAPED BEAM EB WRITING SYSTEM

CROSS-REFERENCE TO RELATED APPLICATIONS

This application is based upon and claims the benefit of priority from the prior Japanese Patent Application No. 2001-302639, filed Sep. 28, 2001, the entire contents of which are incorporated herein by reference.

BACKGROUND OF THE INVENTION

1. Field of the Invention

The present invention relates to a variably shaped beam EB (electron beam) writing system.

2. Description of the Related Art

A manufacturing method of an LSI is as follows. A pattern on the mask is transferred to the resist, developed, and etched on the wafer using an optical stepper or a scanner to form the resist pattern. Thereafter, the pattern of one layer is manufactured on the wafer through various semiconductor processes. Next, the LSI is manufactured by repeating the above-mentioned processes by using the mask having another pattern.

The method of manufacturing the mask used for such the manufacture of the LSI is performed by exposing, developing, and etching the resist on the mask with the variably shaped beam EB writing system.

There is the system by which the resist spread on the wafer is exposed directly by charged beams such as electron beams and the ion beams or optical beams by a variably shaped beam pattern writing system which are also used for the manufacturing method of such a mask.

Such the variably shaped beam EB writing system inputs the pattern data to which information in the pattern to be drawn is described and draws the pattern to be drawn by using information on this pattern data.

In general, a predetermined unit is specified explicitly or implicitly regarding to the length or the position, and a digital value based on this unit is described in the pattern data.

For instance, if a unit is 1.25 nm, 500 nm is set as "400". This unit originates in the design of the variably shaped beam pattern writing system, and, for instance, is an inherent value to system decided by the balance of an electro-optical system and a DAC performance of an analog circuit for the electron beam exposure device.

In general, the position unit and length at the design of the LSI is set independently to the inherent length unit and the position unit of the above-mentioned pattern writing system.

For instance, it is assumed that the pattern transfer to resist is preformed by an optical stepper and the device is designed with 1.25 nm as a unit. When the reduction rate of a used optical stepper is ⅕, a length unit of the design pattern on the mask becomes 6.25 nm.

On the other hand, it is assumed that the unit of the control of the variably shaped beam pattern writing system to write pattern on the mask is 1 nm. At this time, the unit of the pattern on the mask becomes 6.25 nm, and this cannot be represented with the integral multiple of 1 nm, which is the control unit of the variably shaped beam writing system. That is, mismatch between the unit of the pattern and the unit of the device is caused and the following various problems are caused.

The case where a certain pattern becomes a unit and is arranged repeatedly in the LSI pattern will be considered as an example. The pitch of this repetition becomes the integral multiple of 6.25 nm on the mask, too.

For instance, when the pitch is 1237.5 nm (6.25 nm×198), this does not become the integral multiple of 1.00 nm which is the unit of the device. The error is caused at the position of the pattern which is drawn finally when data is made by ignoring the fractional portion of 0.5.

For instance, the shift at the position to which it extends it will be generated in 0.5 nm×100=50 nm in the 100th pattern when there are 100 repetitions.

In avoiding this, there is a method of rearranging the structure of the repetition in data. In this case, there is a problem that the amount of data increases because the data structure of pattern which originally expressed by one array changes more complicated one (such as data structure expressed by several arrays).

The problem of positioning error also appears in the other case, as follows. The original LSI pattern is sometime shrunk in order to enhance the LSI performance. Let say the unit of the design of an original LSI pattern is the integral multiple of that of the variably shaped beam pattern drawing device (for instance, 4 nm on the mask). If the LSI is shrunk by 0.8, then the length unit after reduction becomes 3.2 nm, and does not become the integral multiple of unit 1 nm of the variably shaped beam pattern drawing device, and the above-mentioned problem appears again.

That is, even when the original pattern is 4 nm unit, if the LSI whose pattern is 0.8 times thereof is made, the length unit after reduction becomes 3.2 nm, and does not become the integral multiple of unit 1 nm of the variably shaped beam EB writing system, and the above-mentioned problem appears again.

On the other hand, there is a device which performs the reduction of the above-mentioned entire pattern inside the device according to the variably shaped beam EB writing system. For instance, after the data of the pattern to be drawn is input to the variably shaped beam EB writing system, the reduced pattern data is created from the data by using the computer attached by the device.

However, the calculation time becomes long in a case of reduction rate 0.8, and exceeds the drawing time by far, and the entire system falls into the state of waiting for the end of such a calculation. This remarkably degrades the use efficiency of the entire system.

In addition, this kind of problem is occurred in the development of the new pattern writing system as described below.

For instance, conventionally after putting the device of length unit of 10 nm to practical use, the accuracy of the device has been improved by making the unit a half, such that the unit of first generation's device is 5 nm and the next generation thereof is 2.5 nm.

However, in a new device, it is necessary to draw the pattern data in conventional (Unit 2.5 nm) on the other hand in many cases. Therefore, the necessity for drawing the data with the conventional 2.5 nm unit in addition to the data with 1 nm unit in a new device is caused. Therefore, the above-mentioned problem appears.

Therefore, the mismatch of the unit of the variably shaped beam EB writing system and the unit of the pattern data becomes large, and the above-mentioned problem is caused.

To avoid this, there is a method of assuming the unit to be not 1.25 nm but 1 nm in the next generation's device after the device with 2.5 nm unit. As a result, mismatch can be avoided about the pattern data with 1 nm unit.

On the other hand, a new device should draw in conventional pattern data (2.5 nm unit) in many cases. That is, the necessity for drawing the data with conventional 2.5 nm unit in addition to the data with 1 nm unit is caused in a new device. Therefore, the above-mentioned problem appears.

Various problems as mentioned above have been caused, since the unit of the pattern data and the unit of the pattern writing system shift like this.

Moreover, in a stage continuous movement type Gaussian beam method raster scan device, there is an example of a similar function.

This is assumed that (1) A standard beam size (fixed value) (of Gaussian beam) is assumed to be an integer multiple (n times) and a big beam is formed, and (2) It is assume the scanning speed of the beam to be 1/n at a standard (fixed) speed.

However, in a case of the EB system which uses the variably shaped beam method, since the shape and the size of the (shot) beam for each shot change, a fixed beam size does not exist unlike the case of the Gaussian beam.

Moreover, the beam position does not change continuously, but changes at random in the vector scanning method. Therefore, a constant beam scanning speed does not exist unlike the raster scanning method.

In addition, since it is necessary to control the beam position on the wide plane in the vector scanning method, in many cases, it becomes necessary to correct the deflection distortion with higher-order (including terms more than second order of $x^2$ etc. concerning the position).

After such a correction is performed two-dimensionally, it is necessary that the change in the unit system is consistent in some method.

In addition to this, in the variably shaped beam method, not only the adjustment of positioning but also that of the beam formation is needed.

As mentioned above, by extending the technology performed with the stage continuous movement type Gaussian beam method raster scan device, it is impossible to achieve the function to change the length unit and the position unit in the device of the variably shaped beam vector scanning method.

The items to be adjusted include many things to achieve such a unit change function with the device of the variably shaped beam vector scanning method, and it is difficult to suit other correction functions of the pattern writing system without the contradiction.

Actually, the device equipped with such a function is not reported.

BRIEF SUMMARY OF THE INVENTION

An object of the present invention is to provide a variably shaped beam EB writing system without the problem of mismatch of the above-mentioned unit without necessitating the many processing of the computer and degrading accuracy.

The variably shaped beam EB writing system, which irradiates an energy beam and draws a pattern based on a pattern data to which predetermined pattern information is described, according to the first aspect of the present invention is characterized by comprising: a recognition module configured to recognize at least one of a first length unit to specify a pattern length and a first position unit to specify a position described to the pattern data; an adjustment module configured to adjust at least one of a second length unit to specify a pattern length which is drawn by the variably shaped beam EB writing system and a second position unit to specify a position thereof to a value of which at least one of the first length unit and the first position unit are divided by a natural number; and a drawing module configured to draw a predetermined pattern based on at least one of the second length unit and the second position unit adjusted by the adjustment module, to achieve the above-mentioned object.

The variably shaped beam EB writing system, which irradiates an energy beam and draws a pattern based on a pattern data to which predetermined pattern information is described, according to the second aspect of the present invention is characterized by comprising: a first unit configured to memorize at least one of a length unit to specify a pattern length and a position unit to specify a position described in the pattern data; a second unit configured to process at least one of a data of the length and the position of the pattern data as at least one of a normalized length data and a normalized position data independent on the length unit and the position unit; a third unit configured to convert at least one of the normalized length data and the normalized position data into a physical amount of a length and a position of a pattern drawn by the variably shaped beam EB writing system; and a fourth unit having a same pattern as the pattern described to the pattern data and at least one of a different length unit and a different position unit, configured to obtain a condition which becomes a same physical amount when performing a conversion into the pattern length drawn by the variably shaped beam EB writing system and a physical amount of a position, correct the conversion by the third unit based on the condition, and perform drawing based on the obtained physical amount.

Figure 1:
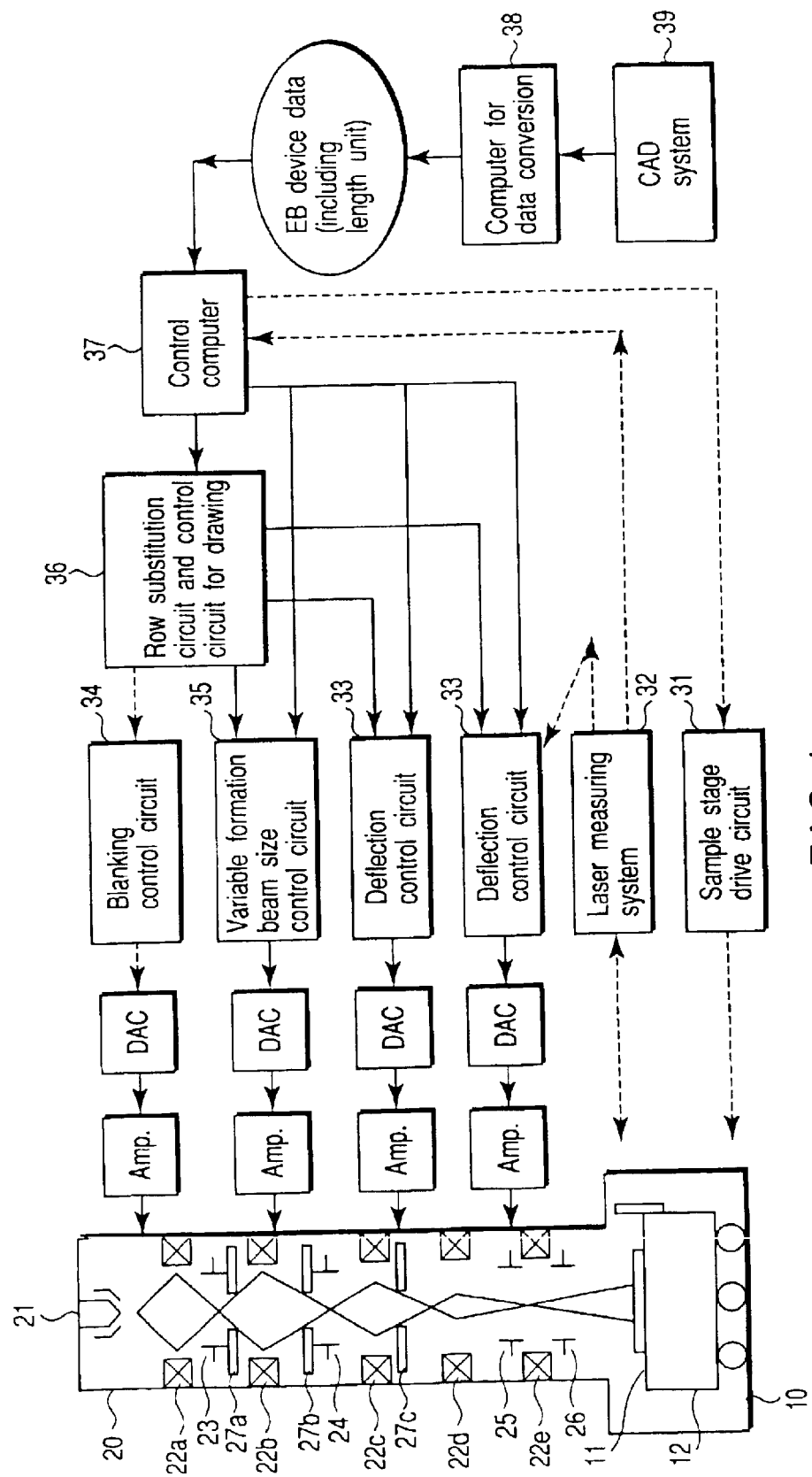
FIG. 1 is a configuration diagram of the variably shaped beam EB writing system used in the present invention.

DETAILED DESCRIPTION OF THE INVENTION (First Embodiment)

Hereinafter, a variably shaped beam EB writing system according to the present invention will be explained in detail referring to the drawings.

FIG. 1 is a schematic diagram showing an electron beam pattern writing system used for the embodiment of the present invention.

The electron beam pattern writing system shown in FIG. 1 comprises a sample room 10, a target 11 (sample), a sample stage 12, an electro-optical tube 20, an electron gun 21, various lens systems 22a to 22e, a blanking board 23, various deflections systems 24 to 26, and beam formation aperture masks 27a, 27b, and 27c.

The electron beam pattern writing system further comprises a sample stage driving circuit 31, a laser measuring system 32, a deflection control circuit 33, a blanking control circuit 34, a variably shaped beam size control circuit 35, a row substitution circuit and drawing control circuit 36, a control computer 37, a data conversion computer 38, and a CAD system 39.

The electron beam pattern writing system adopts the stage continuous movement method. That is, the figure pattern is drawn by moving the stage continuously and controlling the beam position by deflecting the beam.

A belt-shaped area of several millimeters in width which is drawn by one continuous movement in the stage is called a frame. All of the target figure patterns are drawn by repeating the drawing by continuous movement in such a direction (direction of X) in the vertical direction (direction of Y).

The position control of the beam is performed with the main deflector 25 and the sub-deflector 26 while continuously moving. The sub-deflector 26 controls a position of the beam by about an area of 60 μm square (which is called a sub-field). The positioning of the sub-field is performed with the main deflector 25, and the range where the main deflection can be positioned decides the width of the frame (Or, in other word, height).

The movement and the control of the stage is performed by sending the movement instruction from the control computer 37 to the sample stage driving circuit 31. The content of the instruction is two instructions of stop position and the stage speeds when it moves there. The stop position is shown by the laser coordinates.

In a case of drawing the frame, the instruction is first sent to the sample stage driving circuit 31, and the stage 12 is moved to the frame origin. Thereafter, after the instruction of the preparation is sent to the drawing circuit 36, the instruction of the frame end position and the stage speed is sent to the sample stage driving circuit 31.

The control software advances to the operation preparation of the following frame drawing after confirming the movement end of the stage 12 and the operation end of the drawing circuit 36.

The electron beam emitted from the electron gun 21 is turned ON or OFF with the blanking deflection circuit 23. The electron beam pattern writing system enables the dose to be changed by adjusting this irradiation time according to the irradiation position. The beam which passed the blanking board 27a is formed to a rectangular beam and a triangular beam by the deflector 24 for the beam formation, the aperture mask 27b and 27c for the beam formation. Moreover, a size of a rectangular and a triangular size thereof is varied.

The formed beam is deflected and scanned on the target 11 with the main deflector 25 and the sub-deflector 26, and the desire pattern is drawn on the target 11 by the beam scanning.

The acceleration voltage of the electron beam in the electron beam pattern writing system is 50 kV. The maximal variably shaped beam which can be generated is rectangle of 2 μm in height and 2 μm in width and four kinds of right isosceles triangles.

Though eight poles are often used as various deflectors to secure accuracy in the device actually used, to explain here easily, it is assumed the deflector with four poles is used, the voltage input to the deflector from the amplifier is set to Vx, −Vx, Vy, and −Vy, and the independent parameters are two kinds of voltages of the voltage Vx to X-direction and the voltage Vy to y-direction.

In the embodiment, the length unit and the position unit of the variably shaped beam EB writing system is variable effectively and matches to the length unit and the position unit of the pattern described to the pattern data.

For instance, when the unit on the pattern data is 1.25 nm, by changing the unit of the variably shaped beam EB writing system to 1.25 nm, the position accuracy can be maintained without cancellation of significant digits, and the structure of the repetition of the pattern need not be changed.

The case of changing the pattern data to 0.8 times in the variably shaped beam EB writing system can be processed by setting the unit in the variably shaped beam EB writing system to 0.8 times.

By matching the unit in the variably shaped beam EB writing system to the unit of the pattern data, the problem of such a mismatch can be solved.

Several method can be considered as a method of matching the unit in the device to the unit of the pattern data.

By changing the condition of the lens of the electro-optical system, it is also possible to change the sensitivity of the EOS and to effectively change the length unit. However, the degradation of the drawing accuracy might be caused when such an excitation condition of the lens is frequently changed.

To avoid this accuracy degradation, it is necessary to leave the entire system until an optical condition becomes stable with long time. Therefore, whenever the length unit changes in the reticle drawing, a change in an optical condition, a device stop until stabilizing an optical condition, and change in an optical condition and the adjustment processing are performed repeatedly and the production efficiency of the device will be remarkably degraded.

In addition, as other method, there is a method of changing the gain of the amplifier which amplifies the output voltage of the DAC.

However, the amplifier is an analog circuit and it is impossible to change the gain for each reticle in general. The problem on accuracy occurs if it forces it. Only, the one near the exception is a main amplifier in the pattern writing system of the raster scanning.

Since the voltage is gradually changed for the pattern writing system of the raster scanning, the amplifier which uses the integration circuit can be configured. However, since the voltage changes at random for the vector scanning pattern writing system, it is impossible to configure the amplifier with such an integration circuit.

In the present invention, the function to change the unit of a peculiar length and position to the device can be provided without changing the lens excitation condition of the above-mentioned electro-optical system, without changing the operation of the amplifier of each reticle (or, pattern), that is, without degrading the accuracy of the device and deteriorating the efficiency of the device.

This method will be explained in detail as follows.

First of all, the EB is set so that the user can describe the data of the length and position of the input data in the input data. (Or, the user can input the length unit of input data to the EB system at drawing.).

The EB system can know the length unit and the position unit which the EB should match by taking in the "Length unit and position unit of input data" at drawing.

Next, though the EB system carries out necessary digital data processing using the information about the position and the length recorded in the input data, the digital processing does not use the unit of length in data, that is, processing is performed using normalized length and position.

Next, the device converts the obtained data by the digital processing into an input data for analog circuit, and inputs it to various analog circuits.

Here, this conversion is performed with a digital circuit, and the data conversion operation can be changed in the writing system.

This will be explained by the following example of processing position data.

The digital circuit output data is assumed to be (x, y).

The input data to an analog circuit is assumed to be (X, Y).

The digital conversion circuit converts the input data into the data for an analog circuit by calculating, for instance, the following equations.

$$X = a \times x + b \times y + c \times x^2 + d \times x \times y + \ldots$$

$$Y = p \times x + q \times y + r \times x^2 + s \times x \times y + \ldots$$

Here, though a, b, c, ..., p, q are constants during calculating, these values can be changed when starting or resetting the circuit.

By changing these values, it becomes possible to change the operation of data conversion.

In the second invention, by changing the conversion operation, the length unit and the position unit of the device is matched to the length unit and the position unit of the input data (to the device).

An outline of the method how to change the conversion equation will be explained in the following.

The following two method may be applied to obtain the conversion equation.

(Method 1) First of all, the optimal conversion equation (standard conversion equation) for standard unit (ex. 1 nm) is obtained beforehand by an adjustment of EOS (electro-optical system) etc.

At drawing, by using given length unit and position unit, the conversion equation at drawing will be calculated under the following condition.

(Condition) "when the same pattern is described in two input data in which length and position are different, values after data conversion becomes the same."

A detailed explanation for obtaining the conversion equation will be described later.

(Method 2) Though the conversion equation at length unit of the pattern is finally obtained by adjusting the optical deflection system, as an initial condition of the adjustment, the conversion equation obtained under the condition of (1) at this time is used. Even if the length unit changes, the output value (for instance, DAC value) becomes the same according to the condition of (1). The amount of the deflection becomes the same, and the drawing result becomes the same, too. Therefore, it is a condition to make the drawing result the same even in a case describing with a different unit. In (2), the equation obtained by (1) is assumed to be an initial condition, the optical system and the deflection system are adjusted, and the conversion equation for the length unit of the pattern data is obtained.

At this time, the conversion equation obtained by (1) is correct if the standard conversion equation is completely correct. The adjustment is ended instantaneously after adjustment of the optical system since it is confirmed that the conversion equation of (1) is effectively correct. The adjustment will be also ended in a short time still, since the error of the equation obtained by (1) is a little in a case that there is a little error in the standard conversion equation.

The position unit and the length unit in the device can be adjusted to the length unit of the pattern effectively according to such a processing method.

The length unit and the position unit in the device can be adjusted to the length unit of the pattern effectively according to such a processing method.

The above-mentioned "Condition that the value after conversion by the length unit and the position unit is not changed by the change of this conversion operation" according to the present invention is disclosed as follows.

The conversion equation f(x, y) (or the coefficient from which the equation can be led) is assumed to be already obtained in the length unit and the position unit which is used as a standard beforehand. When the length unit is multiplied by k based on this, the conversion function F(x, y):

$$F(x, y) = f(kx, ky) \tag{1}$$

can be obtained.

This corresponds to the above-mentioned condition (The value after conversion by the length unit and the position unit is not changed). That is, f(x, y) is obtained beforehand, and this function F(x, y) can be used when the length unit and the position unit become k times thereof at drawing. It can be proven that this function F(x, y) becomes a conversion equation when the length is multiplied by k based on the above-mentioned restriction condition as follows.

If the length unit becomes k times thereof, the values x and y of the data become x/k and y/k.

If these are substituted to the equation (1), the equation becomes as follows:

$$F(x/k, y/k) = f((x/k) \times k, (y/k) \times k) = f(x, y)$$

That is, since the physical amount (for instance, DAC value) obtained as a conversion result becomes the same even if the length unit is multiplied by k, the drawing result becomes the same.

The example in a case that the conversion function f(x, y) is a polynomial will be shown as a specific example.

The conversion function when the length unit and the position unit is a standard value (pnm) is assumed to be represented as:

$$f(x, y) = a + bx + cy + dx^2 + \ldots + u\, x^n x y^m \tag{2}$$

and specific numerical values after adjustment are obtained as each of these coefficients.

If a ratio (q/p) is shown by k when the length unit of the pattern data is qnm, the above-mentioned function F(x, y) is described as follows:

$$F(x, y) = a + bkx + cky + dk^2 \times x^2 + \ldots + u \times (k^{(n+m)}) \times x^n \times y^m \tag{3}$$

Here, if the equation (3) is transformed to $$F = a' + b' \times x + \ldots u' \times x^n \times y^m + \tag{4}$$

The conversion coefficient is obtained as follows.

$$a' = a$$

$$b' = b \times k$$

$$u' = u \times (k^{(n+m)}) \tag{5}$$

Since this case is one example in the above-mentioned general rule, the physical amount (for instance, DAC value) obtained as a conversion result even if the length unit is multiplied by k becomes the same, and the drawing result becomes the same.

In the system, for instance, the coefficient group a, b, c, ..., u which is adjusted with the standard unit is stored in the device. The coefficient is changed by the equation (5) when the unit is multiplied by k, a new coefficient is used, and equation (4) may be used.

In the polynomial of an arbitrary order, the adjustment rule of the coefficient is as follows.

When the coefficient is obtained by a certain length unit and position unit (snm), the coefficient is shown as follows when the length unit and the position unit are assumed to be multiplied by k (unit is k×snm).

(Coefficient of $X0^m \times Y0^n$ at multiplication by k)

(Coefficient of $x0^m \times y0^n$ in standard unit)$\times k^{(n+m)}$ (Adjustment Of Main Deflection Position)

First of all, the unit adjustment concerning the main deflection position will be explained.

This unit adjustment is performed with the conversion circuit which is in former stage of inside the main deflection control circuit 33 in FIG. 1 to the laser coordinates (Hereafter, called as a "Coordinates conversion circuit").

The coordinates conversion circuit converts the coordinates value (x0, y0) (normalized digital value) of the position given from the upper level into the value (x, y) on the laser coordinates and, at the same time, corrects the position error which depends on the position on the mask.

The coefficient group COEFd2r_a0 to COEFd2r_r2 to perform conversion from a digital value to the laser coordinate system and correction and the sub-field size (lx, ly) (digital value which uses the length unit on the data) are given from the control computer 37 to this circuit. The information is stored and recorded on the buffer memory in the circuit.

At drawing, the information (_x0, _y0) of the main deflection position from the upstream is given to the circuit. This information is the coordinates value of a left lower corner of the sub-field and is a digital value using the length unit on the data.

The circuit obtains the center coordinates (x0, y) of a sub-field as (_x0+lx/2, _y0+ly/2).

Next, the circuit performs the following calculation by using the conversion coefficient group and converts the value of the sub-field center position from the normalized value into the value in the laser coordinate system.

$X = COEFd2r\_a0 + COEFd2r\_b1 \times x0 + COEFd2r\_b2 \times y0 + COEFd2r\_c0 \times x0^2 + COEFd2r\_c1 \times x0 \times y0 + COEFd2r\_c3 \times y0^2$ $y = COEFd2r\_p0 + COEFd2r\_q0 \times x0 + COEFd2r\_q1 \times y0 + COEFd2r \times r0 \times x0^2 + COEFd2r\_r1 \times x0 \times y0 + COEFd2r\_r2 \times y0^2$ Here, the coefficients COEFd2r_a0, . . . can be set from outside of the circuit.

Specifically, the value set from the outside is stored in the register, and the circuit performs the above-mentioned calculation by using the register value.

That is, the conversion equation can be controlled by replacing these coefficients in the system.

The coordinates value (x0, y0) given from the upstream to the circuit is a normalized value. The value changes according to the use unit (for instance, 1.25 nm and 1.0 nm, etc.), too.

On the other hand, the value which is converted into the laser coordinate system should not depend on the former use unit and become a constant correct value.

This adjustment can be achieved by adjusting the values of conversion coefficients COEFd2r. The example of adjusting the coefficient will be shown as follows.

The length unit and the position unit of the electron beam pattern writing system is assumed be adjusted as 1 nm, and the coefficient at that time is assumed to be from COEFd2r_a0 to COEFFd2r_r2.

If the coefficient when the unit is assumed to be Unm is from COEFd2r_a0U to COEFd2r_r2U, the following relational equation is obtained according to the equation (5).

$COEFd2r\_a0U = COEFd2r\_a0$ $COEFd2r\_p0U = COEFd2r\_p0$ $COEFd2r\_b0U = COEFd2r\_b0 \times U$ $COEFd2r\_b1U = COEFd2r\_b1 \times U$ $COEFd2r\_q0U = COEFd2r\_p0 \times U$ $COEFd2r\_q1U = COEFd2r\_q1 \times U$ $COEFd2r\_c0U = COEFd2r\_c0 \times U \times U$ $COEFd2r\_c1U = COEFd2r\_c1 \times U \times U$ $COEFd2r\_c2U = COEFd2r\_c2 \times U \times U$ $COEFd2r\_r0U = COEFd2r\_r0 \times U \times U$ $COEFd2r\_r1U = COEFd2r\_r1 \times U \times U$ $COEFd2r\_r2U = COEFd2r\_r2 \times U \times U$ The conversion equation where the correspondence can be taken by setting these coefficients in the circuit can be used.

Above-mentioned conversion coefficient and COEFd2r_a0 etc. at the unit of 1 nm are obtained beforehand, and the result thereof may be stored in the control computer.

At drawing, the result and the unit of the pattern data described in data for the electron beam device are read, and then the conversion coefficient when the length unit of data is used, i.e., COEFd2r_a0U, etc. can be easily calculated by using both of them according to the above equation.

As mentioned above, the control software may input and set these values to the conversion circuit after obtaining the conversion coefficient.

The circuit memorizes the received coefficient in an internal buffer memory, and converts the coordinates value into the value in the laser coordinate system by using this coefficient whenever the coordinates value is input from the upstream. As a result, the length unit adjustment will be automatically performed.

In the latter part of the main deflection control circuit 33, there is a main deflection distortion correction circuit. The main deflection distortion correction circuit is a digital circuit which calculates the input values Vx and Vy to the main deflection DAC amplifier with the main deflection position, i.e., the digital value (x, y), which is intended to be set and the read value (x, y') of the laser interference meter etc.

Since the input pattern data has values in the laser coordinate system though the correction of the distortion etc. caused by an electro-optical system etc. is performed, the length unit of the pattern data for former device has been processed. Therefore, the unit system adjustment mechanism is unnecessary and usually processing may be performed here.

(Adjustment Of Sub-Deflection Position)

Next, the unit adjustment concerning the sub-deflection position will be explained.

The sub-deflection control circuit performs the control of the sub-deflection position in a main deflection, that is, the control of the position of the beam.

The electron beam pattern writing system shown in FIG. 1 can form four kinds of triangular beams in addition to four corner type beam. It is necessary to adjust the sub-deflection position (swing back deflection) depending on the beam shape corresponding to this.

Therefore, amount of the voltages VoffsetX and VoffsetY (shot shape) for swing back of each beam shape can be set in the sub-deflection control circuit 33. Since the amount is shown by the voltage, if the adjustment selection is performed by the predetermined length unit (1 nm), the value can be used as it is even if the length unit is changed.

Figure 2:
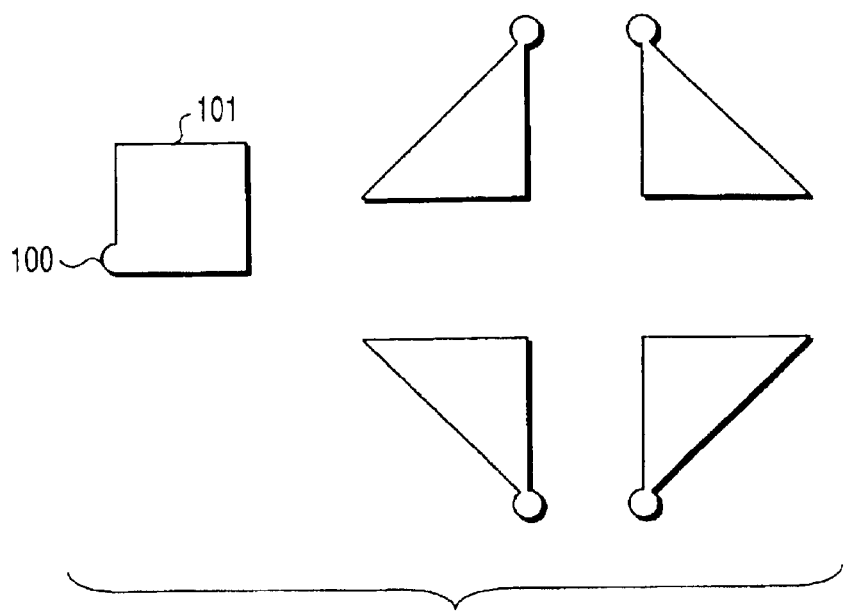
FIG. 2 is a figure which shows rectangular and triangular shots, and a position of the origin.

FIG. 2 shows the origin of the sub-deflection coordinates of each shot. The rectangular 101 has an origin 100 in the left lower corner. The positions of the origin of other triangles are different depending on the shape thereof.

This position of the origin is adjusted not to change on the sample side about the adjustment of an electro-optical system even though the beam size is changed in each shape.

The correction coefficient Sd_r2 from sd_a0 to correct an electro-optical distortion etc. and the sub-field size can be set from the control computer in the sub-deflection control circuit 33 as well as the main deflection control circuit 33. The sub-field size is a digital value which uses the unit in the data given to the device.

The code C showing the shape of the shot and the value (_x0, _y0) (digital value using the unit on the data given to the device) to which information at the sub-deflection position is normalized are given to the sub-deflection control circuit 33 at drawing, and the origin is at the left lower corner of the sub-field.

The sub-deflection control circuit 33 calculates the sub-field center coordinates (x0, y0) by (_x0+lx/2, _y0+ly/2). The voltage is thereafter calculated according to the next equation.

$$Vx = +VoffsetX \text{ (shot shape } C) + sd\_a0 + sd\_b1 \times x0 + sd\_b2 \times y0 + sd\_c0 \times x0^2 + sd\_c1 \times x0 \times y0 + sd\_c3 \times y0^2$$

$$Vy = +VoffsetX \text{ (shot shape } C) + sd\_p0 + sd\_q0 \times x0 + sd\_q1 \times y0 + sd\_r0 \times x0^2 + sd\_r1 \times x0 \times y0 + sd\_r2 \times y0^2$$

Here, + VoffsetX (shot shape C) etc. are the amounts of the swing back adjustment of the sub-deflection according to the above-mentioned shot shape.

The adjustment parameters (sd_a0 etc.) for optical distortions etc. are adjusted and decided by the unit (1 nm) of predetermined length.

The change method is the same as the change of the above-mentioned main deflection correction coefficient though it is necessary to change this coefficient when the length unit is changed.

The coefficient (sd_a0 etc.) when the length unit becomes U can be calculated according to the coefficient in 1 nm of the standard as well as at the time of the adjustment of the main deflection.

The control computer reads the unit recorded on the pattern data for the electron beam pattern writing system, and calculates the corresponding coefficient. The length unit concerning sub-deflection position information is adjusted by setting it in the sub-deflection control circuit.

(Adjustment of Formation Deflection)

Next, the adjustment of the formation deflection will be explained.

It is possible to set the coefficient sh_a0(C) and sh_r2(C) for the distortion adjustment of the optical system according to the shot shape in variably shaped beam size control circuit 35. Here, C is a symbol which shows the shot shape.

The variably shaped beam size control circuit 35 stores and memorizes these coefficients on the buffer memory inside thereof. At drawing, the voltage Vx and Vy applied to the formation deflection are calculated based on the code (C) and the shot size (x0, y0) given from the upstream circuit according to the next equation.

$$Vx = +sp\_a0(C) + sp\_b1(C) \times x0 + sp\_b2(C) \times y0 + sp\_c0(C) \times x0^2 + sp\_c1(C) \times x0 \times y0 + sp\_c3(C) \times y0^2$$

$$Vy = +sp\_p0 + sp\_q0 \times x0 + sp\_q1 \times y0 + sp\_r0 \times x0^2 + sp\_r1 \times x0 \times y0 + sp\_r2 \times y0^2$$

In these coefficients (sp_a0 etc.), the length unit and the position unit is set as 1 nm beforehand, and the coefficients are decided by drawing and automatic adjustment. The coefficient for the unit of other length and positions can be calculated based on the coefficient in 1 nm as well as the main deflection and the sub-deflection, etc. as mentioning above.

The control computer reads the length unit recorded in the data for the electron beam pattern writing system, and decides the corresponding coefficient and sets it to this circuit, as a result, the unit adjustment might be preformed to the circuit.

(Control of Stage Position)

Next, the control of the stage position will be explained.

Since the stage position is performed by controlling the sample stage driving circuit 31 and the unit is expressed in the laser coordinate system, this conversion is performed as follows.

$$x = x0 + x1 \times cv \times x2 \times cv$$

Here, (x, y) is a position of the stage expressed in the laser coordinate system. (x0, y0) is an expression of left lower corner of the reticle with the laser unit system and depends on the reticle size. (x1, y1) is a value to express the chip origin on the mask (chip left lower corner) by the pattern data unit to make the left lower corner of the reticle standard. (x2, y2) is a value where the frame position is expressed by each pattern data based on the origin of chip. As for the frame position, a right center of the frame shows a drawing end position, and a left center of the frame shows a drawing origin. The cv is a conversion coefficient from the unit of the pattern data to the unit of the laser.

The change of the unit is performed by changing the value of the cv as follows.

First of all, the conversion coefficient for the unit which is used as a standard beforehand is obtained. To assume the easiest processing, the unit which is used as this standard may be the same as a standard unit in the distortion correction as mentioned above etc.

The cv as described in equation (5) when the unit of the pattern data becomes knm which is multiplied by k of original unit if a standard unit is assumed to be 1 nm, and this conversion coefficient is assumed to be cv0, $$CV = cv0 \times k$$

can be calculated.

(Control)

In the above-mentioned device configuration, the entire control is as follows.

First of all, the coefficient for the position correction on the mask, the distortion of main deflection correction coefficient, the sub-deflection correction coefficient, and the formation deflection correction coefficient are obtained beforehand by a predetermined length unit and unit (1 nm) of the position. These are obtained by auto-adjustment of the optical system and by actually drawing and measuring the test pattern.

Next, the obtained result is stored in the predetermined disk of the pattern writing system in the form of the file.

When drawing the predetermined mask, the control software reads the length unit described in the pattern data for the electron beam pattern writing system. Moreover, the deflection coefficient of various standards obtained beforehand of the unit of predetermined length is read from the disk.

Next, various correction coefficient groups corresponding to the unit of the pattern data are calculated from the read unit of the pattern data and various standard correction coefficients. This result is set in the laser coordinates conversion circuit, the sub-deflection control circuit 33, and the formation deflection control circuit 35.

The sub-field size information is set in the laser coordinates conversion circuit and the sub-deflection control circuit 33.

Next, after reading the data of the frame from the file of the electron beam drawing data and transferring it to the pattern data buffer memory, the software sets coordinates at the starting position and the coordinates at end position of the frame in the stage control circuit, and thereafter starts various control circuits and the graphics processing circuits.

The drawing processing circuit performs processing of development of the compressed data and the shot division, etc. This processing is performed by using the digital data described in the pattern data as it is. That is, it is processed as the normalized amount.

After such a processing is performed, the data is sent to the main deflection control circuit 33 and the sub-deflection control circuit 33, etc. as follows.

The data of the sub-field position is sent to the conversion circuit of the laser coordinates in the main deflection control circuit 33, and the adjustment of the length unit and the position unit is performed like the above-mentioned and is converted into the laser coordinates here. And, the distortion of the electro-optical system is corrected with the optical distortion correction circuit in the main deflection control circuit 33, and is converted into the voltage value. This voltage value is input to the main deflection amplifier, and is applied to the main deflector.

The shot position information and the code of the shape of the shot are sent to the sub-deflection control circuit 33. And, the unit conversion is performed in the sub-deflection control circuit 33, and information at the shot position is converted into the voltage value. The value is input to the sub-deflection amplifier, and is applied to the sub-deflector.

The shot size information and the code of the shape of the shot are sent to the formation deflection control circuit 35. And, the unit conversion is performed in the formation deflection control circuit 35, and the shot size information is converted into the voltage value. The value is input to the deflection of the formation of the value amplifier, and is applied to the formation deflector.

The timing adjustment etc. between each circuit may be performed as usual. For instance, after ending the sub-field positioning, the main deflection control circuit 33 sends an electric signal to the sub-deflection control circuit 33 and the formation deflection control circuit. As a result, after positioning a sub-field, the shot in a sub-field can be irradiated. The device operates an electric circuit, moves the stage while irradiating the beam, and stops the movement of the stage when reaching the end of the stage set by the control software. The control software recognizes the end of the movement of the stage, recognizes interrupt (Or, change in a predetermined register of the stage control circuit) by the stage control circuit, and repeats the above-mentioned procedure to draw the following frame thereafter.

It becomes possible to match the unit of the device on the pattern data in each pattern to be drawn by such processing. Therefore, if one pattern data is set in the reticle, the adjustment of the unit of each reticle will be performed. If two or more pattern data are set in one reticle and the length units thereof are different, the length units of each pattern data will be adjusted in one reticle.

(Second Embodiment)

Next, the second embodiment of the present invention will be explained.

The reduction of the entire pattern is performed in the variably shaped beam EB writing system in this embodiment.

According to the variably shaped beam EB writing system shown in FIG. 1, it becomes possible to perform the reduction of the entire pattern in the device as follows, in addition, the long calculation processing before drawing is not needed, and the position accuracy is not degraded.

At drawing the pattern on the mask, the data of the chip arrangement information on the mask in addition to the chip data (hereinafter, abbreviated as "Layout data") is input to the device.

The reduction rate of each chip can be changed if the reduction rate of each chip can be described in this layout data. A concrete method of the reduction of the chip and drawing is as follows. The procedure at drawing in one chip (reduction rate: 0.7) in the mask here will be explained.

First of all, the control software of the variably shaped beam EB writing system reads the reduction rate of 0.7 for this each chip from the layout data, and stores it in the memory of the control computer 37. Moreover, the length unit of the corresponding chip is read from the file of the pattern data of the chip and is stored similarly.

Next, when 1.5 nm is described as a position unit length of the pattern data, the control software decides the length unit in the device as 1.5 nm×0.7=1.05 nm.

The desired pattern will be formed if the 1.05 nm is assumed to be the length unit, and the processing thereafter is as well as the above-mentioned first embodiment.

If the length unit described in the pattern data 1.2 nm and the magnification described in the layout data is 0.9 in other chips in the same reticle, 1.2 nm×0.9=1.08 nm may used as the unit at drawing.

Thus, the magnification of each chip in the mask is changed. In addition, it is possible to draw while adjusting the length unit of each chip in the device.

Moreover, the conversion coefficient (conversion equation) is obtained on the computer, set directly in the circuit, and used to draw in the second embodiment. However, a more correct conversion coefficient can be obtained by setting the obtained conversion coefficient to be an initial value and adjusting the deflection system before drawing the reticle. The conversion coefficient obtained in this manner is set in the circuit and is used to draw.

Though the length unit of the pattern is not the integer multiple of a standard unit of the device (length unit and position unit when an electro-optical system is adjusted), naturally, the present invention can be applied at the integer multiple.

The unit of the control of the device is matched to the length unit of the pattern in the above-mentioned second embodiment, but it is not limited to this. For instance, when the length unit is 1 nm, and when the device is adjusted the length unit of the pattern data is 2.5 nm, the length unit of the pattern data is converted with 1.25 nm which is half thereof, and the length unit of the device may be matched to 1.25 nm.

This example will be shown as follows.

When the data is stored in the buffer memory or before storage thereof, if the value described in the data is twice, the unit of data becomes 1.25 nm which is half thereof. The desire pattern can be drawn if the control unit of the device is matched to this 1.25 nm.

According to this method, the rounding error which occurs by the digital processing of the shot division with the drawing control circuit etc. becomes (1.25/2) nm, and becomes small more than rounding error (2.5/2 nm) when processing like 2.5 nm.

That is, drawing with higher accuracy to use the length unit (2.5 nm) of the pattern as it is can be achieved.

Since as an operation of which data of position and size is doubled, the binary data is shifted stored in the computer only by one bit, it is possible to achieve it at easily and high speed.

This processing may be performed with the computer when transferring it to the buffer memory or may be performed with hardware as follows. For instance, the data described in the pattern data may be sent to the buffer memory, and the data may be sent by bit-shifting when the data is sent from the buffer memory to the circuit of the subordinate position.

The bit shift can be easily achieved since it is performed by way of only the shift register. It is possible to perform high-speed processing without disarranging the pipeline operation of the hardware.

The above-mentioned operation does not limit to twice and can be executed with an arbitrary multiple. If it is an n power of two, the operation can be achieved by shifting n bits. Moreover, the operation can be achieved by adding a binary value which is shifted by one bit to the former binary value in case of three times. Correspondingly, the unit of the device control may be the $(\frac{1}{2})^n$ times of the pattern data unit in the former case, and $\frac{1}{3}$ times of the pattern data unit in the latter case.

The present invention is not limited to the example of using the electron beam pattern writing system of the variably shaped in mask drawing method as described above. When the resist on the wafer is exposed directly with the electron beam pattern writing system of the variably shaped method may be applied.

When the data is converted into a physical amount or the control unit of the device (laser coordinates value or the DAC value), the length unit and the position unit are adjusted. However, it is unnecessary to perform the adjustment at the same time as the conversion and is also possible to perform the adjustment about before and after the conversion,.

For instance, when the unit is the k times of the standard unit, the data before conversion may be converted as (x', y')=(x/k, y/k), and converted to the physical amount and the control unit of the device by using the conversion function f(x, y) from the value of (x', y').

Moreover, though only the polynomial is discussed as a conversion type, it is not limited to this, and it is possible to apply to an arbitrary equation. It is shown that the Gauss distribution can be used as an example. For instance, when the optical system can be adjusted as $$f(x, y)=c \times exp[-\{(x-x0)^2+(y-y0)^2\}/\sigma^2],$$

and the reference unit is 1 nm, it is assumed that the constants c, x0, y0, σ is decided and the values of constants c', x0', y0', σ' are selected.

The conversion equation when the unit is multiplied by k may be sown as follows.

$$F(x, y)=c \times exp[-\{(kx-x0)^2+(ky-y0)^2\}/\sigma^2]$$

$$c \times exp-\{(x-x0/k)^2+(y-y0/k)^2\}/(\sigma/k)^2$$

The values of c, x0, y0 and σ can be set from the outside for the circuit. When the unit is multiplied by k, each value is calculated on the computer by the following equation and the result thereof may be set to the circuit. Then, the circuit may be operated.

$$c''=c'$$

$$x0''=x0'/k$$

$$y0''=y0'/k$$

$$\sigma''=\sigma'/\sigma k$$

For instance, the adjustment of an electro-optical system is performed so that the length unit and the position unit are set as 1 nm once a week. At each mask drawing, the correction coefficient may be adjusted by using the result by synchronizing with the change for the unit as mentioned above.

Moreover, a minute adjustment concerning the deflection of the optical system can be performed before drawing in each mask in addition to the adjustment once a week. The minute adjustment may be performed for all items or only for a part of items, for instance, a minute adjustment of the correction coefficient of the formation deflection.

Though the control software calculates the coefficients of the polynomial of the conversion equation and sets them to the circuit, the present invention is not limited to this method.

For instance, the processing such as performing this calculation, and setting the value to the register can be achieved in the circuit. An above-mentioned example (adjustment of the main deflection position) will be explained. In this case, when the optical system and the distortion correction are adjusted, the coefficients, i.e., $COEFd2r\_b0$, etc. in the obtained standard unit are recorded in the hard drive.

When the software is activated or the reticle is drawn continuously, the control software reads the coefficient at the start, and sets the coefficient in the circuit.

For instance, at drawing, the change rate U of the scale for each chip in the reticle (unit of the pattern data/standard unit) is set in the circuit.

The circuit comprises the DSP for instance, and the conversion processing etc. of the coefficient may be described in the microprogram which operates it. In the DSP processing, as well as the above-mentioned first embodiment, from the coefficient $COEFd2r\_b0$ etc. in standard unit given beforehand and the change rate U of the scale, the coefficient such as $COEFd2r\_bU$ may be obtained by:

$$COEFd2r\_a0U=COEFd2r\_a0$$

$$COEFd2r\_p0U=COEFd2r\_p0$$

$$COEFd2r\_b0U=COEFd2r\_b0 \times U$$

$$COEFd2r\_b1U=COEFd2r\_b1 \times U \ldots$$

and the calculation result may be set to the register of a part calculating the conversion equation in the circuit.

Or, the coefficient is not calculated by the DSP, but the circuit which calculates the conversion equation is changed from the above-mentioned embodiment. The calculation may be preformed by the following equation.

$$x=COEFd2r\_a0+COEFd2r\_b1 \times U \times x0+COEFd2r\_b2 \times U \times y0+ \\ COEFd2r\_c0 \times U2 \times x0^2+COEFd2r\_c1 \times U2 \times x0 \times y0+COEFd2r\_ \\ c3 \times U2 \times y0^2$$

$$y=COEFd2r\_p0+COEFd2r\_q0 \times U \times x0+COEFd2r\_q1 \times U \times y0+ \\ COEFd2r\_r0 \times U2 \times x0^2+COEFd2r\_r1 \times U2 \times x0 \times y0+COEFd2r\_ \\ r2 \times U2 \times y0^2$$

Here, $COEFd2r\_a0$ etc. are the coefficients in standard unit as well as the above-mentioned case. U is the change rate of the unit (unit of the pattern data/standard unit).

The above-mentioned unit adjustment may be performed for each reticle, or may be performed for every block in the reticle.

Here, the adjustment of the pattern data and the restriction of the device will be explained. Though only the sub-deflection position is described for easiness, it is similar to the main deflection position and the formation deflection.

It is assumed that the number of bits which can be input to the device to which the invention is applied is 16 bits (which is decided by the number of bits and the maximum swing width of the digital circuit (which normalizes the sub-deflection position). It is assumed that the maximum swing width of the sub-deflection is 64 $\mu$m (sub-field size: 64 $\mu$m), and the standard conversion equation is obtained in 1 nm unit.

FIRST EXAMPLE

The input data is assumed to be the data of the conventional device and to be created that the length unit is 2.5 nm, the number of bits is 16, and the sub-deflection in the maximum swing width is 160 $\mu$m (sub-field size is 160 $\mu$m).

At this time, it is impossible to correspond to sub-field size 160 $\mu$m on the device. However, this problem can be corresponded easily by preprocessing drawing.

For instance, the sub-field size of the data to be drawn may be converted into 60 $\mu$m with the software at outside the device or on the computer attached to the device. Since the sub-field of 160 $\mu$m×160 $\mu$m is only divided into 9 fields in the operation, the processing can be finished in a short time even if the software is used.

If the method explained in the above-mentioned embodiment is applied to adjust the unit of the device with 2.5 nm to the data to which the adjustment of the sub-field size is finished by the preprocessing as mentioned above, it is possible to draw the desired pattern.

SECOND EXAMPLE

It is assumed that the input data is the data of other devices (next generation's device), and is created such that the length unit is 0.625 nm, the number of bits is 17, and the sub-deflection in the maximum swing width is 100 $\mu$m (sub-field size 160 $\mu$m).

At this time, there are two following problems of (1) the sub-field size of data is larger than the sub-field size of 64 $\mu$m which can be corresponded by the device, and (2) the number of bits of the data is larger than that of bits of 16 which can be corresponded by the device.

However, these problems can be corresponded easily by the preprocessing drawing. The sub-field size of the data to be drawn may be converted into 50 $\mu$m by the software at outside the device or on the computer attached to the device.

The sub-field size becomes 64 $\mu$m or less and the number of bits becomes 16 bits, too by this operation. Since the sub-field of 160 $\mu$m×160 $\mu$m is divided into 9 fields and number of output bits are changed in the processing, the processing can be finished in a short time even if the software is used.

If the method explained in the above-mentioned embodiment is applied to adjust the unit of the device with 0.625 nm to the data to which the adjustment of the sub-field size is finished by the preprocessing as mentioned above, it is possible to draw the desired pattern.

Though, in the above-mentioned embodiments, though the example of the stage continuous movement method is explained, it is not limited to this and it is possible to apply also the pattern writing system of the step & repetition method and the pattern writing system with the variable speed stage.

By matching an effective control unit in the device, on the pattern length and the position unit, it become possible to control the increase of the calculation time and the increase of the amount of data in the conventional art and draw the pattern on an accurate position. As a result, it become possible to enhance the use efficiency of the variably shaped beam EB writing system without degrading accuracy, and lower the manufacturing cost of the mask and the LSI.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A variably shaped beam EB writing system which irradiates an energy beam and draws a pattern based on a pattern data to which predetermined pattern information is described, comprising:

a recognition unit configured to recognize at least one of a first length unit and a first position unit which is described to the pattern data, the first length defining a pattern length, the first position unit defining a pattern position;

a change unit configured to change at least one of a second length unit and a second position unit which are defined to the variably shaped beam EB writing system to a value of which at least one of the first length unit and the first position unit is divided by a natural number; and a drawing unit configured to draw a predetermined pattern based on at least one of the second length unit and the second position unit changed by the change unit.

2. The variably shaped beam EB writing system according to claim 1, further comprising a memory unit configured to memorize a deflection amount of the energy beam or a position correction equation corresponding to at least one of the first length unit and the first position unit, wherein the change unit changes at least one of the second length unit and the second position unit based on the position correction equation or the deflection amount memorized in the memory unit.

3. A variably shaped beam EB writing system which irradiates an energy beam and draws a pattern based on a pattern data to which predetermined pattern information is described, comprising:

a first unit configured to memorize at least one of a length unit to define a pattern length and a position unit to define a position described in the pattern data;

a second unit configured to change at least one of a length data and the position of the pattern data as at least one of a normalized length data and a normalized position data independent of the length unit and the position unit;

a third unit configured to convert at least one of the normalized length data and the normalized position data into a physical amount of a length and a position of a pattern drawn by the variably shaped beam EB writing system; and a fourth unit having at least one of a length unit and position unit different from a unit of the pattern, configured to correct the physical amount converted by the third unit based on a condition in which a physical amount of a length and a position of a pattern drawn by the variably shaped beam EB writing system substantially coincides with a physical amount defined in the pattern data, and perform drawing based on the corrected physical amount.

4. The variably shaped beam EB writing system according to claim 3, further comprising a fifth unit configured to memorize a conversion equation for at least one of a predetermined length unit and a predetermined position unit beforehand, wherein the conversion equation memorized in the fifth unit is changed to satisfy the condition obtained by the fourth unit based on at least one of the length unit and the position unit memorized in the first unit, and the correction by the fourth unit is performed based on the changed conversion equation.

5. The variably shaped beam EB writing system according to claim 4, wherein processing is performed by using a conversion equation F(x, y) which is k times of the predetermined length unit or the predetermined position unit instead of f(kx, ky), in a case that the conversion equation for at least one of the predetermined length unit and the predetermined position unit is f(x, y).

6. The variably shaped beam EB writing system according to claim 3, further comprising a fifth unit configured to memorize a conversion equation for at least one of a predetermined length unit and a predetermined position unit beforehand, wherein the conversion equation memorized in the fifth unit is changed to satisfy the condition obtained by the fourth unit based on at least one of the length unit and the position unit memorized in the first unit, an optical system is adjusted based on the changed conversion equation, and a correction by the fourth unit is performed based on the conversion equation obtained as a result of the adjustment of the optical system.

7. The variably shaped beam EB writing system according to claim 6, wherein a processing is performed by using a conversion equation F(x, y) which is k times of the predetermined length unit the predetermined position unit instead of f(kx, ky), in a case that the conversion equation for at least one of the predetermined length unit and the predetermined position unit is f(x, y).

8. A variably shaped beam EB writing system, which irradiates an energy beam and draws a pattern based on a pattern data to which predetermined pattern information is described, comprising:

a recognition unit configured to recognize at least one of a first length unit and a first position unit to define figures described in the pattern data;

a change unit configured to change at least one of a second length unit and a second position unit with which the variably shaped beam EB writing system is controlled, to a value which is a rational number times at least one of the first length unit and the first position unit; and a drawing unit configured to draw a predetermined pattern based on at least one of the second length unit and the second position unit changed by the change unit.

9. The variably shaped beam EB writing system according to claim 8, further comprising a memory unit configured to memorize at least one of a predetermined deflection correction model, a predetermined deflection correction equation or predetermined values used in the predetermined deflection correction model or the predetermined deflection correction equation, which are obtained for predetermined position unit and length unit, wherein the change unit configured to change at least one of the predetermined deflection correction model, the predetermined deflection correction equation or the predetermined values in the memory unit to that for the first position unit and first length unit which are used to describe the pattern data; and the drawing unit configured to draw the predetermined pattern, by using at least one of the predetermined deflection correction model, the predetermined deflection correction equation or the predetermined values in the memory unit and the changing unit, referring both (i) a predetermined position unit and a predetermined length unit and (ii) the first position unit and the first length unit.

10. A variably shaped beam EB writing system which irradiates an energy beam and draws a pattern based on a pattern data to which predetermined pattern information is described, comprising:

a memory unit configured to memorize at least one of a first length unit and a position unit to define figures described in the pattern data;

a first change unit configured to change the pattern data, almost without using the first length unit and position unit which are used to describe the pattern data;

a second change unit configured to convert the pattern data obtained by using the first change unit to the other data, which is described by using a second length unit and a second position unit;

a function-change unit configured to change a conversion function of the second changing unit, depending on and using a value stored in the memory unit;

a drawing unit configured to draw patterns by using the output of the second change unit with controlling the first change unit and the second change unit using the data in the memory unit.

11. The variably shaped beam EB writing system according to claim 10, further comprising;

a second memory unit configured to store at least one equation which is used to change data in the second change unit or at least one parameter to fix a way of changing data in the second change unit, wherein at least one equation and at least one parameter are to be determined for a predetermined length and position unit, and the function-change unit configured to modify the equation stored in the second memory unit depending on the difference between the predetermined unit and the first unit and set the modified equation in the second change unit, or to modify the parameter stored in the second memory unit depending on the difference between the predetermined unit and the first unit and set in the second change unit.

12. The variably shaped beam EB writing system according to claim 11, wherein:

the second change unit calculates the equation f(kx, ky), when the first unit is k times of the predetermined unit and the conversion equation for the predetermined unit is f(x, y).

13. The variably shaped beam EB writing system according to claim 10, wherein:

the function-change unit is configured to change of the conversion function under the condition that, when only one pattern and several length and position units are used to generate several pattern data and those generated pattern data are input to the EB system, the outputs of the second change unit are the same as all the several patterns.

14. The variably shaped beam EB writing system according to claim 13, further comprising;

the second memory unit configured to store at least one equation which is used to change data in the second change unit or at least one parameter to fix the way of changing data in the second change unit, wherein at least one equation and at least one parameter are to be determined for a predetermined length and position unit, and the function-change unit is configured to modify the equation stored in the second memory unit depending on the difference between the predetermined unit and the first unit and to set the modified equation in the second change unit, or to modify the parameter stored in the second memory unit depending on the difference between the predetermined unit and the first unit and to set the modified parameter in the second change unit.

15. The variably shaped beam EB writing system according to claim 14, wherein:

the second changing unit is configured to calculate the equation f(kx, ky), when the first unit is k times of the predetermined unit and the conversion equation for the predetermined unit is f(x, y).

16. The variably shaped beam EB writing system according to claim 13, further comprising:

a second memory unit configured to memorize a conversion equation for at least one of a predetermined length unit and a predetermined position unit beforehand, wherein the conversion equation memorized in the second memory unit is changed to satisfy said condition by using at least one of the first length unit and the position unit stored in the first memory unit, an electron optical system is adjusted based on the changed conversion equation, and a correction is performed based on the conversion equation obtained as a result of the adjustment of the electron optical system.

* * * * *